(12) United States Patent
Kim et al.

(10) Patent No.: US 6,274,418 B1
(45) Date of Patent: Aug. 14, 2001

(54) METHOD OF MANUFACTURING FLASH MEMORY CELL

(75) Inventors: Sang Soo Kim; Sung Mun Jung; Kwi Wook Kim, all of Kyungki-do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/609,159

(22) Filed: Jun. 30, 2000

(30) Foreign Application Priority Data

Jun. 30, 1999 (KR) .................................................. 99 25780

(51) Int. Cl.[7] .............................................. H01L 21/8238
(52) U.S. Cl. ........................................... 438/211; 438/258
(58) Field of Search .................................... 438/258, 261, 438/264, 652, 655, 211

(56) References Cited

U.S. PATENT DOCUMENTS

| | | | |
|---|---|---|---|
| 5,229,311 | 7/1993 | Lai et al. | 437/43 |
| 5,479,368 | 12/1995 | Keshtbod | 365/185.01 |
| 5,815,439 | 9/1998 | Korsh et al. | 365/185.24 |
| 5,872,035 | 2/1999 | Kim et al. | 438/261 |
| 5,901,089 | 5/1999 | Korsh et al. | 365/185.24 |
| 5,962,890 | * 10/1999 | Sato | 257/320 |
| 6,008,091 | * 12/1999 | Gregor et al. | 438/261 |
| 6,074,915 | * 6/2000 | Chen et al. | 438/258 |

FOREIGN PATENT DOCUMENTS

| | | |
|---|---|---|
| 5-259474 | 10/1993 | (JP) . |
| 6-251592 | 9/1994 | (JP) . |
| 8-45292 | 2/1996 | (JP) . |
| 8-235886 | 9/1996 | (JP) . |
| 11-177072 | 7/1999 | (JP) . |
| 11-186420 | 7/1999 | (JP) . |

* cited by examiner

*Primary Examiner*—David Nelms
*Assistant Examiner*—David Vu
(74) *Attorney, Agent, or Firm*—Pennie & Edmonds LLP

(57) ABSTRACT

The present invention relates to a method of manufacturing a flash memory cell. In order to solve a problem that a reliability of a device is degraded according as electron injected into a floating gate leaks to an exterior due to various stimulus, the floating gate of the flash memory cell is formed dividely into a upper layer and a lower layer with respect to a charge barrier layer so that the leakage of the electrons injected into the floating gate can be prevented from external stimulus, thereby improving a reliability of the memory device.

6 Claims, 1 Drawing Sheet

METHOD OF MANUFACTURING FLASH MEMORY CELL

BACKGROUND OF THE INVENTION

1. Field of the Invention

The present invention relates to a method of forming a flash memory cell and more particularly to a method of manufacturing a flash memory cell capable of preventing a loss of charges injected into a floating gate thereof.

2. Description of the Prior Art

A principle of data write operation in a flash memory device is to make a program/erase status by applying an appropriate voltage to a source, a drain and a control gate and then charging or discharging electrons to a floating gate, applying an appropriate voltage to a source, a drain and a control gate.

FIG. 1 is a cross-sectional view showing a method of manufacturing a conventional flash memory cell, especially, a stack gate flash memory cell.

A gate oxide layer 11 is formed on a semiconductor substrate 10, and a polysilicon layer 12 for a floating gate is formed on an entire structure. Then, a patterning process is performed to form the floating gate. Sequentially, a dielectric layer 13 and a polysilicon layer 14 for a control gate are formed on the entire structure. Then, the dielectric layer 13 and the polysilicon layer 14 are patterned by a self-alignment etching process, thereby forming a control gate 14. Next, a source region S and a drain region D are formed by performing an ion implantation process.

In a program operation of the stack gate flash memory cell, voltages of 9 V and 5 V are applied to the control gate terminal Vg and the drain terminal Vd, respectively. If such voltages are applied, a channel pinch-off phenomenon occurs at the drain, and electrons injected at the source S obtains an energy by moving along a surface channel and passing through a high electric field adjacent to the drain D. Some of hot electrons which are formed by the obtained energy pass beyond a potential barrier and are injected into the floating gate 12. On the contrary, in an erase operation, voltages of −9 V and 4.3 V are applied to the control gate terminal Vg and the source terminal Vs, respectively. If such voltages are applied, F-N tunneling occurs toward the gate oxide layer 11 of the source which is overlapped with the floating gate, so that the electrons charged in the floating gate 12 are leaked out.

A most important factor determining a reliability of the stack gate flash memory device is data loss fail. That is, the electrons injected into the floating gate leak through various paths to an exterior due to various stimulus such as time, temperature, external bias and the like, so that an original program status is not maintained and the data is lost. Additionally, among the paths, the electron-outflow toward the gate oxide layer of the source is very serious, and therefore, the reliability of the device is degraded.

SUMMARY OF THE INVENTION

It is, therefore, an object of the present invention to provide a method of manufacturing a flash memory cell capable of preventing an electron-leakage of a floating gate by forming dividedly the floating gate of the flash memory cell into an upper layer and a lower layer about a charge barrier layer.

In order to achieve the above object, a method of forming a flash memory cell in accordance with the present invention comprises the steps of forming a first polysilicon layer on a semiconductor substrate having a gate oxide layer; forming a charge barrier layer on said first polysilicon layer; forming a second polysilicon layer on said charge barrier layer; patterning said second polysilicon layer, said charge barrier layer and said first polysilicon layer, thereby to form a floating gate having said upper polysilicon layer and said lower polysilicon layer divided about said charge barrier layer and forming a dielectric layer and a polysilicon layer for a control gate on an entire structure and patterning said dielectric layer and said polysilicon layer by using a self-alignment etching process thereby to form a control gate.

DETAILED DESCRIPTION OF THE PREFERRED EMBODIMENTS

Hereinafter, the preferred embodiments of the present invention will be described in detail with reference to accompanying drawings.

Figure 1:
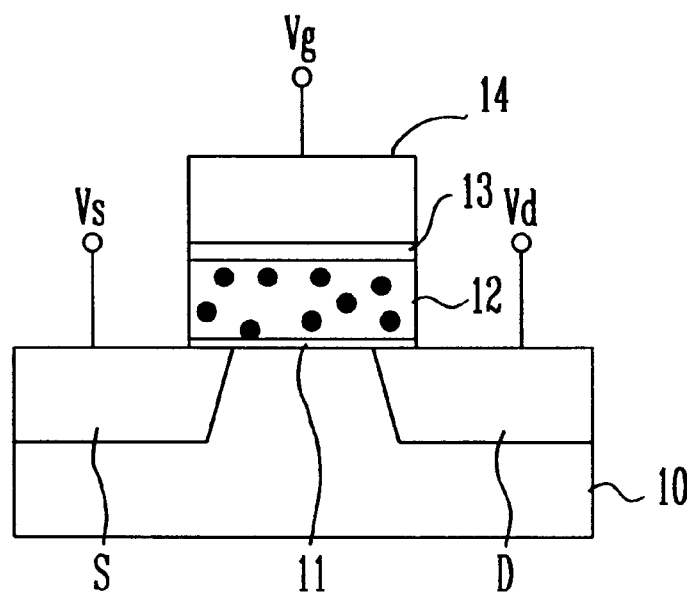
FIG. 1 is a cross-sectional view shoving a method of forming a conventional flash memory cell.
Figure 2:
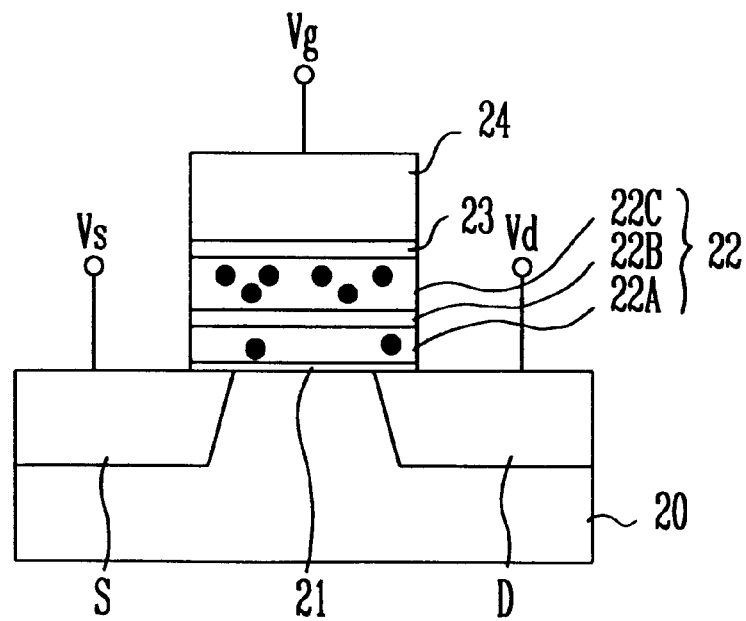
FIG. 2 is a cross-sectional view showing a method of manufacturing a flash memory cell in accordance with the present invention.

FIG. 2 is a cross-sectional view showing a method of manufacturing a flash memory cell, especially a stack gate flash memory cell in accordance with the present invention.

As shown, a gate oxide layer 21 is formed on a semiconductor substrate 20, and a first polysilicon layer 22A, a charge barrier layer 22B and a second polysilicon layer 22C are sequentially formed on an entire structure. Then, a patterning process is carried out to form a floating gate 22 which has a triple structure composing of the first polysilicon layer 22A, the charge barrier layer 22B and the second polysilicon layer 22C. Next, a dielectric layer 23 and a polysilicon layer 24 for a control gate are formed on a resultant entire structure. Then, the dielectric layer 23 and the polysilicon layer 24 are patterned by using a self-alignment etching process, so that a control gate 24 is formed. At this point, the charge barrier layer 22B is formed of a nitride layer to a thickness of 10 to 40 Å.

For a program operation of such stack gate flash memory cell, if voltages of 9 V and 5 V are applied to a control gate terminal Vg and a drain terminal Vd, respectively, most of electrons injected into the floating gate 22 by a hot carrier injection are accumulated to the second polysilicon layer 22C, which is formed on a upper portion of the charge barrier layer 22B, due to F-N tunneling. Generally, in case of charge loss, it is well known that, if about 10% of the electrons injected into the floating gate leak, a reliability failure occurs. In the present invention, since most (more than 90%) of the electrons injected into the floating gate exists on the second polysilicon layer 22C, which is formed on the upper portion of the charge barrier layer 22B, the charge leakage can be prevented unless the erase operation is intentionally performed.

As described above, by forming divinely the floating gate of the flash memory cell into an upper layer and a lower layer with respect to a charge barrier layer so as to prevent the charge leakage, the electrons injected into the floating gate during the program operation does not leak and the electrons can be maintained within the floating gate, thereby improving the reliability of the flash memory device.

What is claimed is:

1. A method of manufacturing a flash memory cell, comprising the steps of:

a) forming a first polysilicon layer on a semiconductor substrate having a gate oxide layer;
b) forming a charge barrier layer on said first polysilicon layer;
c) forming a second polysilicon layer on said charge barrier layer;
d) patterning said second polysilicon layer, said charge barrier layer and said first polysilicon layer thereby to form a floating gate having said second polysilicon layer and said first polysilicon layer divided by said charge barrier layer; and
e) forming a dielectric layer and a third polysilicon layer for a control gate on an entrie structure and patterning said dielectric layer and said third polysilicon layer by using a self-alignment etching process, thereby to form a control gate.

2. The method as recited in claim 1, wherein said charge barrier layer is formed of a nitride layer.

3. The method as recited in claim 1, wherein said charge barrier layer is formed to a thickness of 10 to 40 Å.

4. A method of manufacturing a flash memory cell, comprising the steps of:

a) forming a first polysilicon layer on a semiconductor substrate having a gate oxide layer;
b) forming a charge barrier layer on said first polysilicon layer;
c) forming a second polysilicon layer on said charge barrier layer;
d) forming a floating gate by patterning said second polysilicon layer, said charge barrier layer and said first polysilicon layer;
e) forming a dielectric layer on the floating gate;
f) forming a third polysilicon layer on the dielectric layer; and
g) forming a control gate by patterning the third polysilicon layer and the dielectric layer with a self-alignment etching process such that at least a portion of the third polysilicon layer remains on the dielectric layer.

5. The method as recited in claim 4, wherein said charge barrier layer is formed of a nitride layer.

6. The method as recited in claim 4, wherein said charge barrier layer is formed to a thickness of 10 to 40 Å.

\* \* \* \* \*